United States Patent [19]

Thome

[11] 4,045,647

[45] Aug. 30, 1977

[54] FLUID TIGHT MOVABLE PASSAGE

[76] Inventor: Paul Thome, 8 rue Coutureau, Saint-Cloud Hauts-de-Seine, France

[21] Appl. No.: 631,403

[22] Filed: Nov. 12, 1975

[51] Int. Cl.$^2$ .............................................. B23K 9/00
[52] U.S. Cl. ................................. 219/121 EB; 219/72
[58] Field of Search .......................... 219/121 EB, 72; 160/180, 201, 218; 292/307 R, 317, DIG. 45; 34/242

[56] References Cited

U.S. PATENT DOCUMENTS

| | | | |
|---|---|---|---|
| 3,626,142 | 12/1971 | King .............................. | 219/121 EB |
| 3,719,791 | 3/1973 | Peyrot .......................... | 219/121 EB |
| 3,748,432 | 7/1973 | Bosworth et al. ............ | 219/121 EB |
| 3,835,291 | 9/1974 | Sciaky .......................... | 219/121 EB |

Primary Examiner—J. V. Truhe
Assistant Examiner—Fred E. Bell
Attorney, Agent, or Firm—Karl W. Flocks

[57] ABSTRACT

The invention relates to a device for displacing a fluid-tight passage along a pre-determined rectilinear path on a wall separating two media, the device comprising: a flexible coupling adapted to be opened and closed longitudinally by progressive deformation and covering the rectilinear path, the coupling being constituted by an assembly of two identical L-shaped bands each having two faces perpendicular to each other, applied against each other by one face along a plane perpendicular to the wall and applied against said wall by their other faces arranged in line with each other, a chamber comprising a mobile fluid-tight passage on said flexible coupling, astride the assembly of the two faces of the bands applied against each other and inside which the coupling is opened and then re-closed; the chamber is not directly supported on the wall and its fluid-tightness is maintained during its displacement on the coupling, means being provided for opening and closing said coupling inside the chamber and for displacing the chamber with respect to the coupling, profiled ribs forming guides on the coupling and co-operating with grooves in the mobile chamber and also serving to position the coupling in the chamber, the latter further comprising a guard-ring delimited by fluid-tight joints in the chamber supported by the two faces of the coupling and by the ribs of the coupling sliding inside the chamber.

9 Claims, 24 Drawing Figures

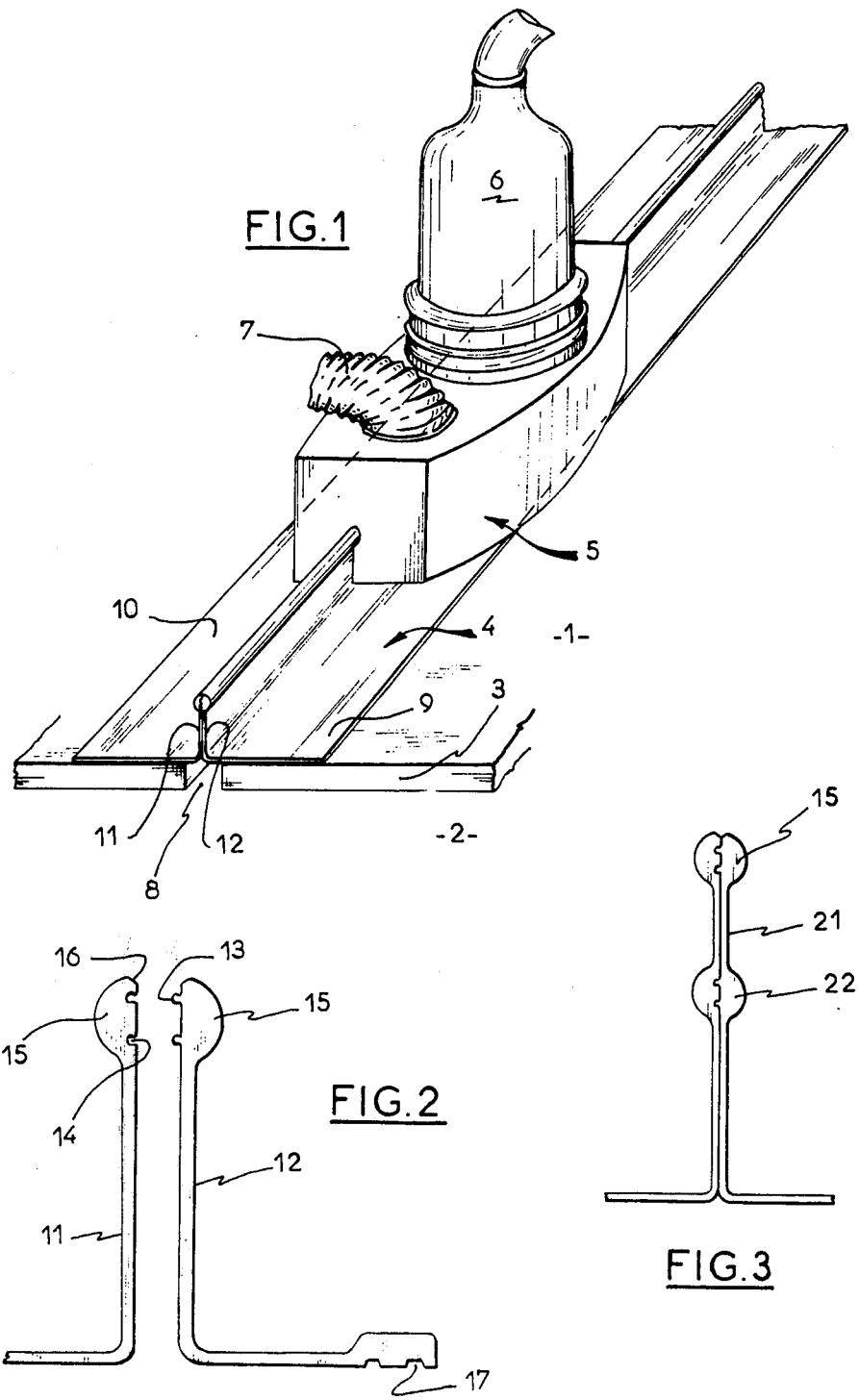

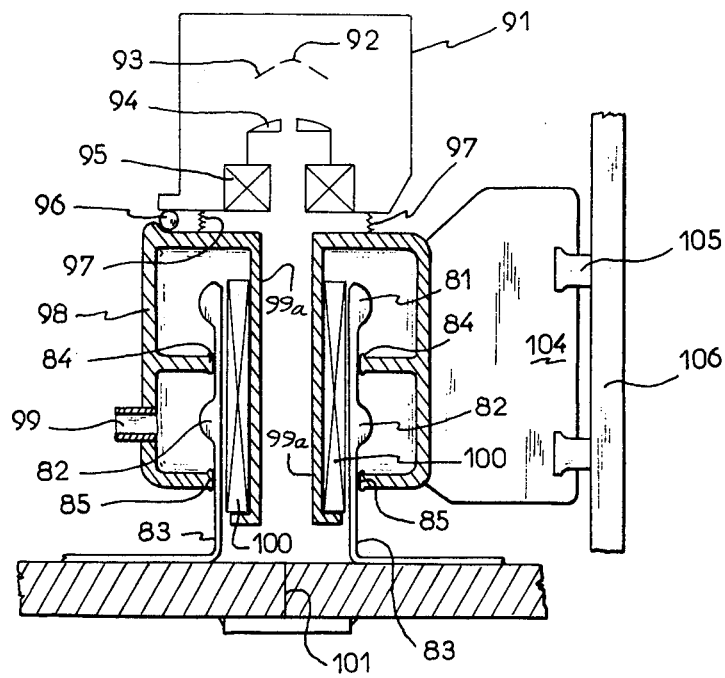
FIG.9
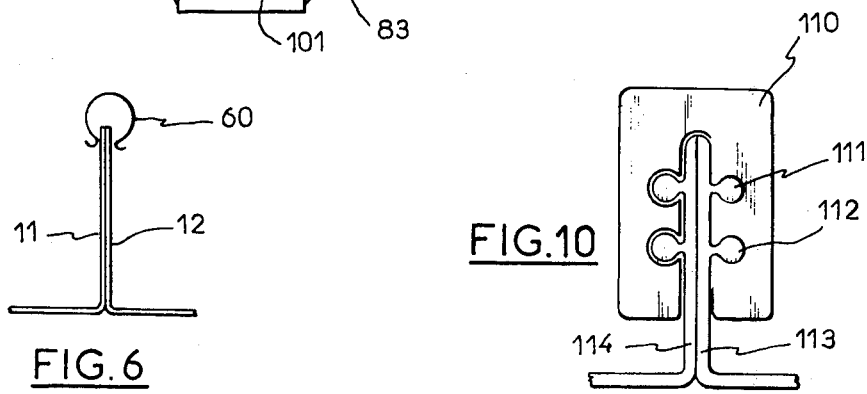
FIG.6
FIG.10
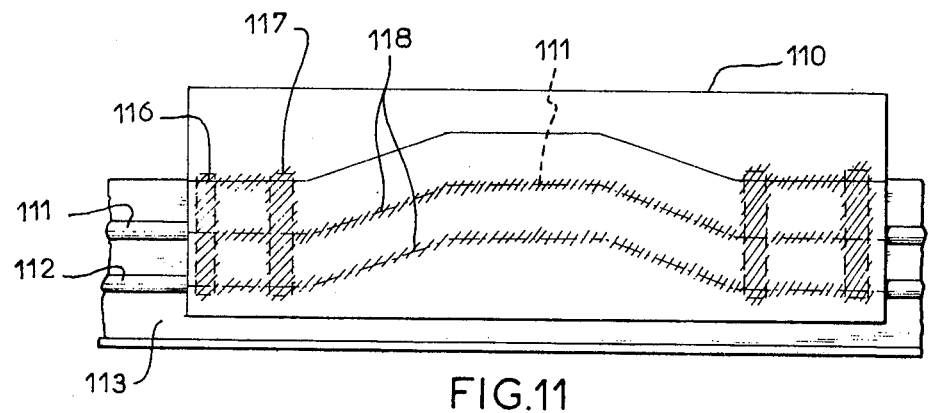
FIG.11

FLUID TIGHT MOVABLE PASSAGE

The present invention relates to fluid-tight passages through a wall which separates two media, these passages being capable of displacement on this wall along a path defined previously, without any interruption of fluid-tightness during the course of this displacement.

At the present time, practically all known fluid-tight passages are fixed in position which permit movement of the shafts in rotation or in axial translation, and sometimes sweeping over a sector of space when these passages are associated with a universal joint which is coupled in a fluid-tight manner to the wall.

All this provides only a partial solution for the various movements and operations which it would be desirable to carry out in the interior of a confined space.

This is the case for example of various kinds of work associated with "glove-box" techniques with controlled atmosphere, when products or effluents are handled which are toxic, corrosive, radio-active, attacked by the ambient atmosphere, etc.

The same considerations apply to operations which must be carried out under vacuum inside chambers or receptacles, and which it is desired to actuate from the exterior of this chamber; and more generally for any operation carried out in a medium having a chemical composition and physical conditions determined from a different medium, through the separating wall.

Devices have been proposed fairly recently, according to which a mobile receptacle slides in a fluid-tight manner on the wall, being supported on the edges of an opening which represents the path of the fluid-tight passage, and also on a tape which covers this opening. These devices are costly and limited in their applications. They actually impose accurate geometrical tolerances in order to make the edges of the opening and the tape level, and also carefully-finished surface conditions in order to avoid leakages during the displacement of the receptacle. These requirements also imply that these devices are difficult to use for paths of great length, and that it is impossible to use them for surfaces or paths of any shape.

The device according to the invention enables these drawbacks to be avoided. According to the invention in fact, it is possible, without breaking the fluid-tightness, to move a passage carried by a receptacle without having to worry about the geometrical tolerances of the edges of the opening in the wall, about their surface condition, about the shape of this wall, or about the shape and length of the path. The receptacle does not at any moment come into contact with the wall.

The invention will be better understood by means of the description which follows. Given two media separated by a fluid-tight wall and such that it is desired to operate from one medium to the other along a given curve cut in the said wall, the method of operation will be as follows or similar:

A device referred to in this text as a "fluid-tight mobile passage" (FMP) which will be coupled in a fluid-tight manner to the said wall. This FMP comprises a number of important parts:

a. A special flexible coupling which covers the displacement curve considered;

b. A special mobile chamber (receptacle) sliding in a fluid-tight manner on this coupling. It ensures the opening and closure of the coupling inside the chamber;

c. Associated members: tools and fixed-position passages on the chamber, external auxiliaries, etc.

In consequence, the frontier which separates one medium from the other medium comprises the wall, the flexible coupling and the chamber.

The principle of operation of the FMP and its characteristic features are as follows:

The coupling is constituted by two flexible bands or tapes (plastic materials or the like) having a straight section of L-shape. These bands are positioned and/or sealed on the wall considered which forms the frontier between one medium and the other. They rest directly or through the intermediary of a supporting member on this wall. They are placed facing each other and come into contact with each other in a fluid-tight manner by their face (or lip) which is roughly perpendicular to the said wall.

There is thus available a flexible coupling which covers and forms the curve along which it is desired to move a fluid-tight passage which will permit operations to be effected from one medium to the other. The lips of this coupling forced one on the other in a fluid-tight manner, will be opened for access through the coupling.

In order to effect this opening of the coupling without interrupting the continuity of the frontier separating the two media, a special chamber is employed. This mobile chamber is placed astride on the upright lips of the coupling which it clamps together and on which it moves in a fluid-tight manner. Inside this chamber, the coupling is opened by separation of the lips which are in contact, and is then re-closed before leaving the chamber.

In its principle, this chamber which ensures the automatic opening and closure of the coupling, and this latter are similar to a double zip-fastener. Their characteristic arrangements which have been prepared so as to ensure and maintain the fluid-tightness will be described later.

On the mobile chamber is provided a passage for the operation of a tool contained in the chamber; this passage is located facing the opening of the coupling.

The invention can best be understood by referring to the accompanying drawings in which:

FIG. 1 is a perspective overall view of the apparatus and its arrangement in the present invention;

FIG. 2 is enlarged edge view of oppositely facing bands of FIG. 1;

FIG. 3 are the bands with additional portions for added safety of fluid-tightness;

FIG. 6 is an edge view of the bands with additional clamping applied;

FIG. 9 is a section view along line IX—IX of FIG. 7;

FIGS. 10 and 11 are side and plan views respectively of a slightly different embodiment of the coupling and the mobile chamber;

Figure 12A:
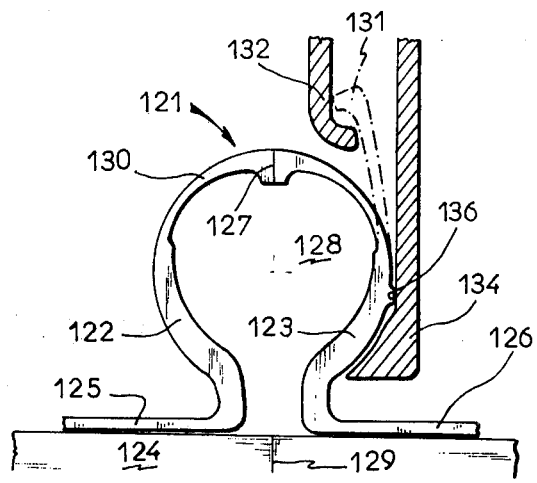
Figure 12B:
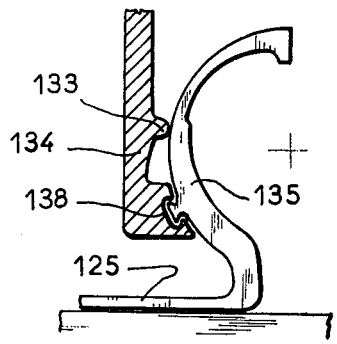
Figure 12C:
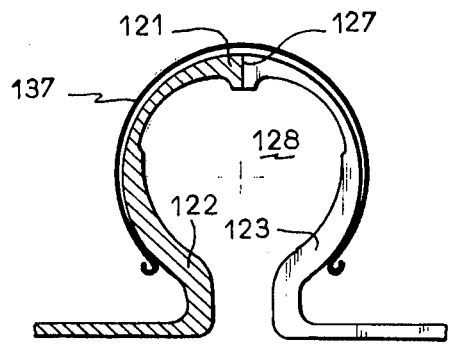
Figure 13B:
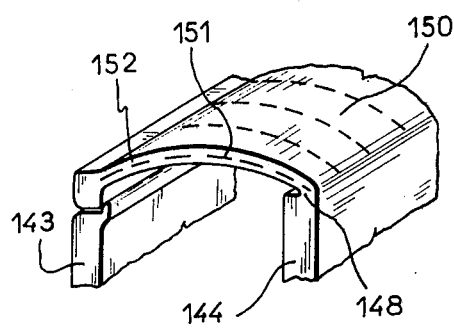
Figure 13A:
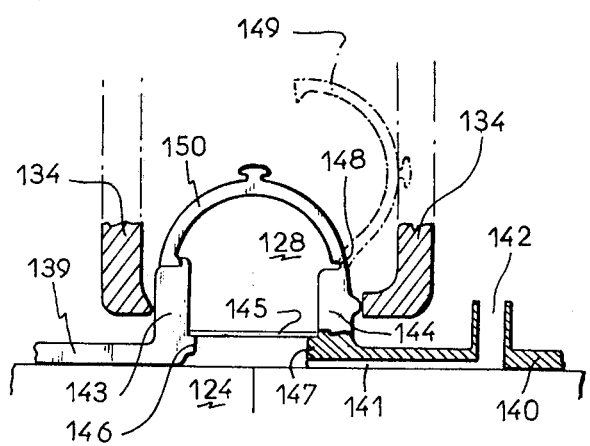
Figure 13C:
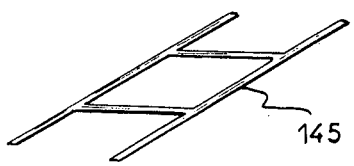
Figure 14A:
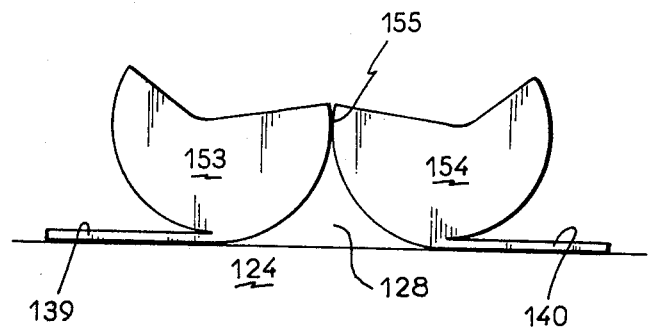
Figure 14B:
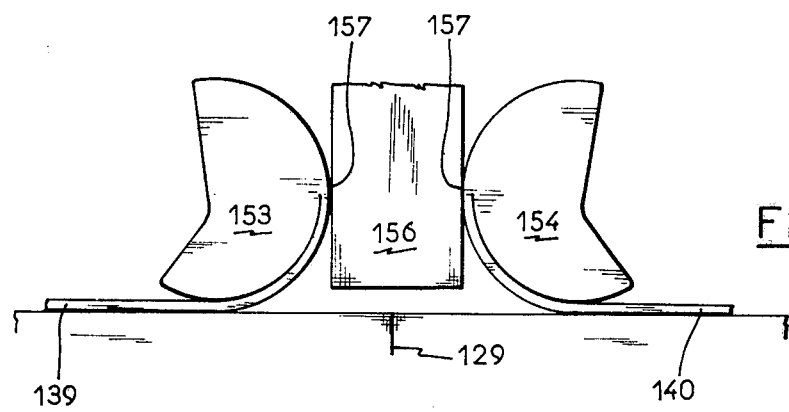
Figure 15:
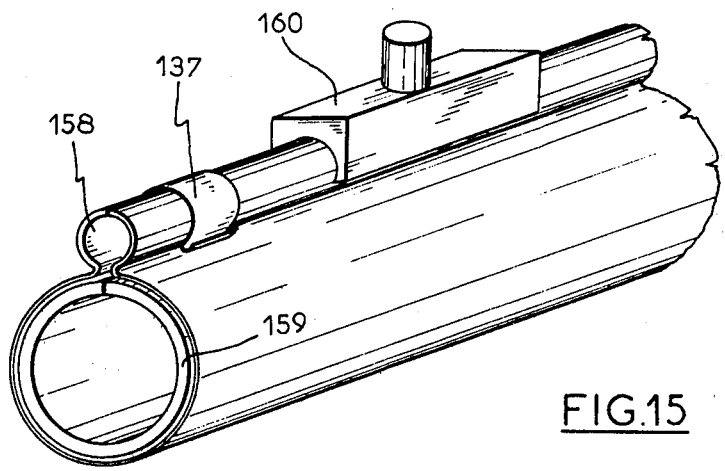
Figure 16:
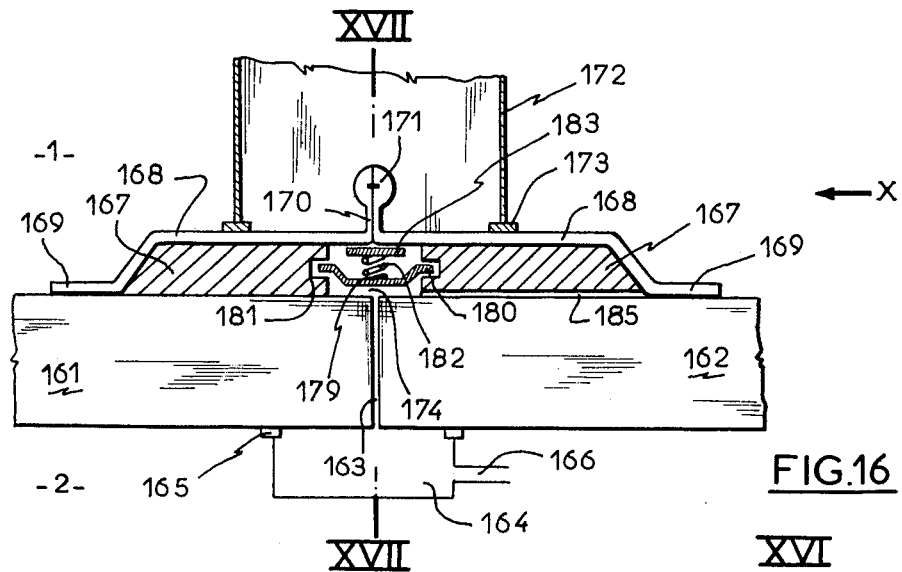
Figure 17:
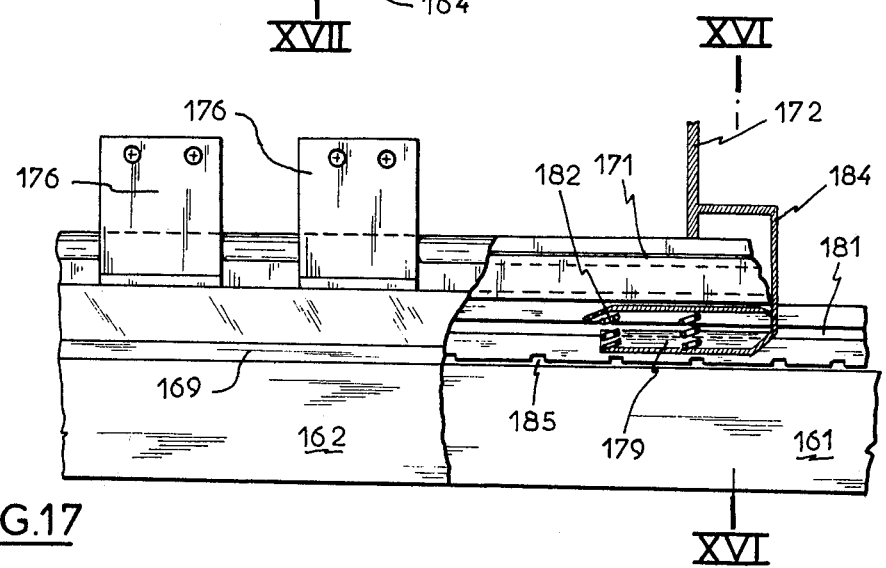
Figure 18:
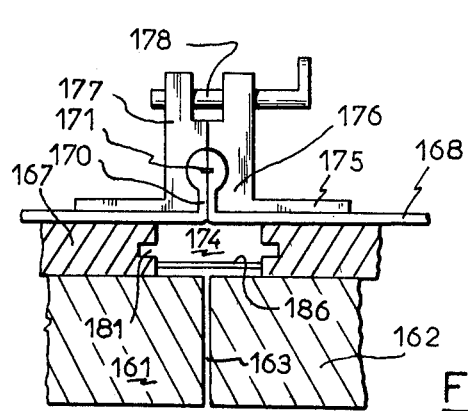
Figure 19:
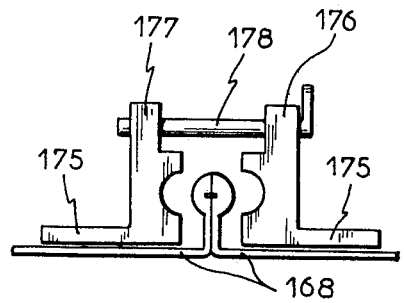

FIGS. 12a, 12b, and 12c are partial section and side elevations illustrating an omega shaped coupling;

FIGS. 13a, 13b, and 13c are a partial section and side view and perspective views of portions of another embodiment of the coupling of the present invention;

FIGS. 14a and 14b are side elevations of another embodiment of the couplings formed of cylindrical sections;

FIG. 15 is a perspective view showing application of the couplings of the type shown in FIGS. 12a-12c;

FIGS. 16, 17, 18, and 19 are another embodiment of the invention with a modified chamber which may be used with electronic welding by bombardment of two sheets, with FIG. 16 being a section along line XVI—XVI of FIG. 17, and FIG. 17 being a partial section along line XVII—XVII of FIG. 16, and FIGS. 18 and 19 showing end elevations of clamping members shown in side elevation in FIG. 16 in association with couplings.

The preceding arrangements are illustrated in FIG. 1.

The frontier which separates the media 1 and 2 is constituted by a wall 3 of the flexible coupling 4 of the mobile chamber 5, and the auxiliaries of this latter 6 and 7.

The curve or path along which it is desired to operate from one medium on the other is in this case represented by the separation 8.

The coupling is formed by two bands which rest respectively by their faces 9 and 10 on the wall 3, while their upright faces (lips) 11 and 12 are forced together one on the other.

In a manner of speaking, the trolley swallows these upright lips. The opening and closure of the coupling, by the separation and subsequent rejoining of the two lips is effected in the interior of the chamber.

The lips of the bands are provided with projections and recesses which are forced one into the other when closing the coupling. The elasticity of these joint fittings is sufficient to hold these lips one against the other by snap action. This assembly can be rendered fluid-tight merely by greasing. An over-pressure of the external medium 1 (FIG. 1), helps to apply these lips against each other and makes the fluid-tightness perfect. These joint fittings also ensure correct and reproducible positioning of one lip on the other.

Portions of extra thickness profiled with the band (as are also the joint projections) serve as guides for the lips of the coupling when the latter are engaged in the opening formed in the chamber. They also serve to guide each lip accurately on the corresponding bearing surfaces of the chamber, in order that the sliding of the lips on these bearing portions may be effected without affecting the fluid-tightness when the coupling is first opened and then closed.

In FIG. 2 there can be seen a straight or rectangular section of the two oppositely-facing bands with their respective lips 11 and 12. The joint fittings are constituted by the male ribs 13 on the lip 12 engaged in the female slots 14 of the lip 11. The profiled guides 15 have a bevelled surface at 16 which serves to facilitate the fluid-tight greasing when the lips are fitted one against the other.

The supporting faces are provided with grooves 17 which are coated with grease and facilitate simply the fluid-tightness on the supporting wall.

In FIG. 3 there is seen the rectangular section of two bands forming a coupling, on which is provided additional safety for fluid-tightness (guard ring). The external over-pressure forces the flexible portions 21 of the lips against each other, these portions being comprised between the guides 15 and 22 which carry the engagement ribs and slots.

In order to ensure a pre-clamping of the lips, effected in the previous examples by male ribs and female slots facing each other, there may possibly be found an advantage in employing other methods. For example a forcing effect of one band on the other will be obtained by employing magnetic tapes; or alternatively an elastic keeper ring 60 will be employed (see FIG. 6) which will clamp together the adjacent edges of the lips. The keeper ring is removed and then replaced in position in order to open the coupling locally; these operations are carried out inside the chamber.

In order to maintain complete fluid-tightness during the course of displacement, the coupling and the mobile chamber which ensures the opening and closure of the coupling, are designed in an original manner.

As stated above, the coupling is characterized by lips perpendicular to the support of the coupling on the surface considered, and these lips are clamped one on the other along the length of the coupling in a fluid-tight manner.

As regards the mobile chamber, this is mounted astride these raised edges. It plays the part of a double slider of a "lightning fastener", which would open and immediately re-close this fastener or coupling during the course of its displacement, but which must also comply with the essential requirements of fluid-tightness. It should be noted that this chamber or slider is not at any moment in contact with the wall; it is supported by appropriate means which also ensure its displacement.

The mobile chamber has the following characteristics:

It is mounted astride the raised edges of the lips;
it is provided with one or more fluid-tight joints which rub against the lips of the band;
devices are provided for guiding the band inside the space formed by the chamber and the fluid-tightness joints, these devices ensuring the opening and closure of the coupling;
the bands are supported inside the chamber by members which reduce the friction forces to a minimum (rollers or sliding surfaces).
an upper plate receives the tools intended to be employed from one medium to another through the opening of the couplings. When there is a difference of pressure between the two media considered, matters are so arranged as to place the joints in such manner that the forces on the lips of the bands are reduced to the minimum. This arrangement will correspondingly reduce the friction forces created by the displacements of the mobile chamber;
auxiliary devices controlling the nature of the medium inside the chamber (vacuum, controlled atmosphere, etc.) and others serving to guide the operating tool during the course of the displacements.

The mobile chamber has a fluid-tight joint which rubs and slides over the coupling (or rather on the lips of this coupling) during its displacements. This particular joint is re-closed on itself, it describes a curve which is supported on the external faces of the lips and which passes from one lip to the other while clamping together the engaged guides 15.

Figure 4:
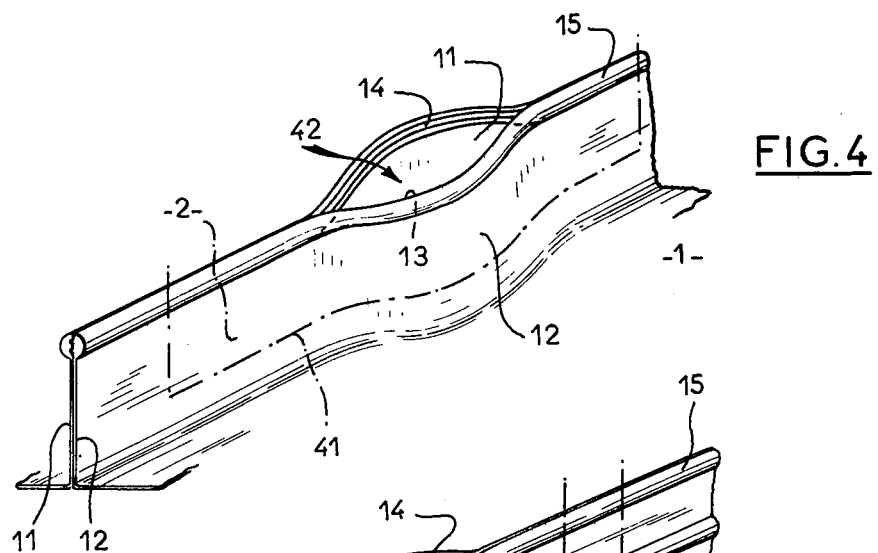
FIG. 4 is a perspective view of the coupling of the bands of FIG. 2.

In FIG. 4, there have been shown the coupling and the contact curve 41 of this chamber joint on the coupling. Inside the chamber, the lips are separated, leaving a space 42, and then the guides 15 become again engaged so as to re-close the coupling by means of the ribs 13 and slots 14. The external medium 1 surrounds the coupling up to the bearing surface of this joint, the curve of which is thus outlined; in the interior of this curve, the coupling is surrounded by the medium 2. It is obviously desirable to make all the necessary arrangements so that the flexible lips rub at any moment over the entire length of the joint while the coupling is deformed by opening and then closing this joint.

Figure 5:
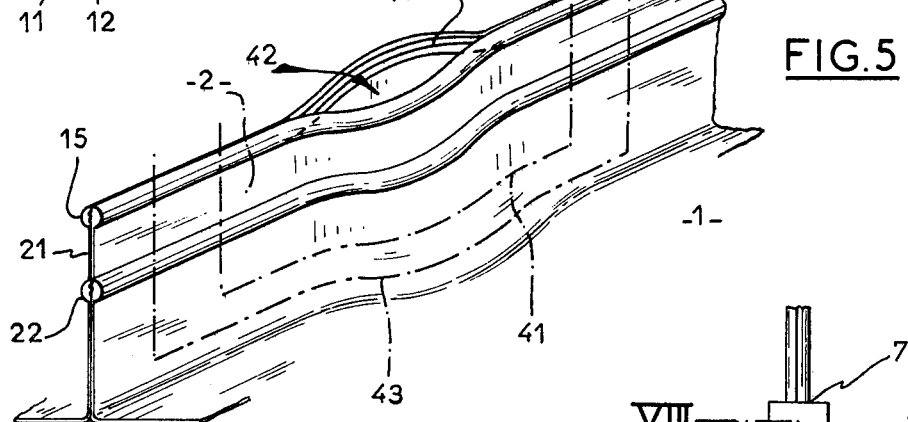
FIG. 5 is a perspective view of the coupling of the bands of FIG. 3.

In order to improve the fluid-tightness, there may also be provided a "guard ring" delimited by a double joint. The profile of this double joint 41 and 43 is indicated in FIG. 5, this profile being suitable for a coupling provided itself with a double guide forming a "guard ring" (see FIG. 3).

Assuming that it is desired to create a vacuum in the medium 2, there would be two pumping stages, the first in the guard ring between the surfaces of the joints 41 and 43, the second inside the joint 41.

Figure 7:
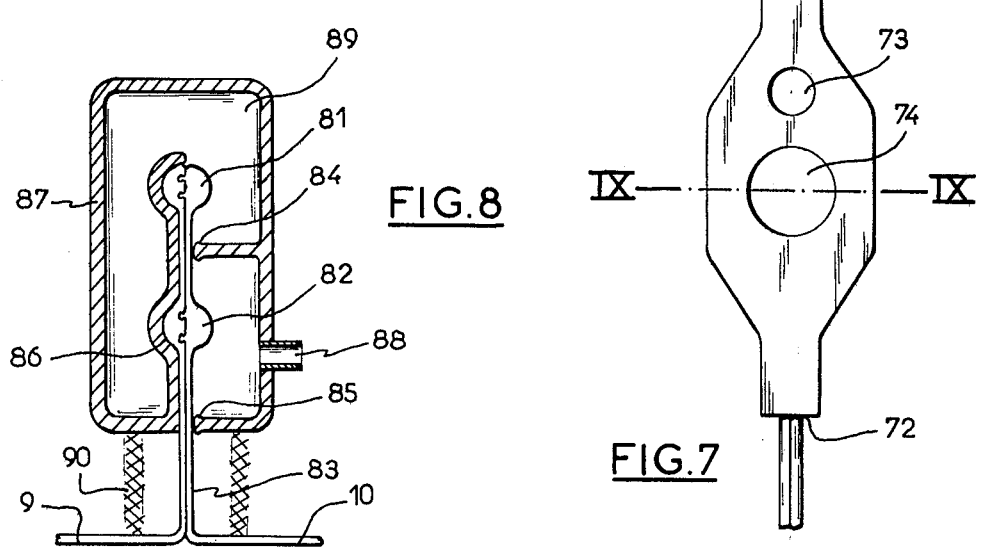
FIG. 7 is a plan view of the mobile chamber mounted astride the coupling.

FIG. 7 shows a plan view of the mobile chamber mounted astride the coupling. The guides 15 of the bands pass in at 71 and pass out at 72. Penetrations on the chamber serve for pumping at 73 when working under vacuum for example, while at 74 there is received a tool which is located vertically above the opening of the coupling.

Figure 8:
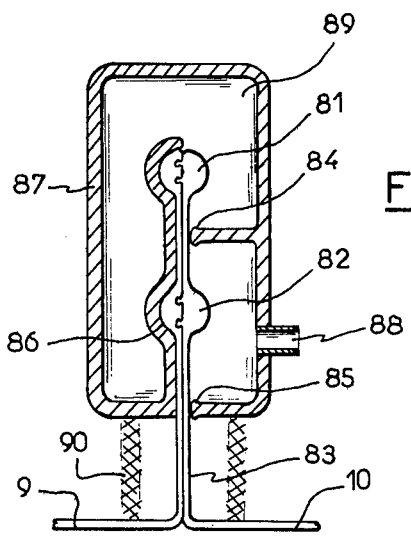
FIG. 8 is a section view along line VIII—VIII of FIG. 7.

The section VIII—VIII of FIG. 7 is shown in FIG. 8. Lips with double fluid-tightness have been chosen with two guides 81 and 82 (see also FIGS. 3 and 5). The mobile chamber 87 is astride the coupling 83 and is provided in this case with a guard ring delimited by the joints 84 and 85 which rub against the outer faces of the bands; the inlet joint is represented by 86. The pipe 88 represents symbolically a pumping connection for the guard ring when the interior 89 of the chamber is kept under vacuum.

FIG. 9 represents the section IX—IX of FIG. 7. The mobile chamber 98 is astride the coupling which is here in the open position. The joints 84 and 85 of this chamber delimit a guard ring which is pumped through the orifice 99. The chamber comprises a portion 99a which ensures the spacing apart of the bands 83; these bands are supported on rollers 100 held by the part 99a. The distance between these rollers and the joints 84 and 85 is regulated in such manner as to keep these joints in rubbing contact on the lips 83 of the coupling.

In this figure there is also indicated a coupling with double fluid-tightness and with two guides 81 and 82. There has also been indicated an electron gun which plays the part of a tool and which is intended to carry out the welding 101 by an electron beam.

This gun 91 comprises a cathode 92, an electrode 93, an anode 94 and a focussing coil 95. It is coupled by a flexible joint 97 to the chamber 98. Balls 96 permit its displacement over the surface of the chamber in such manner as to keep it in line with the path 101.

The chamber is carried by a bracket 104 which is displaced mechanically on the rails 105 of the plate 106. Numerous other auxiliary members may be added to this mobile chamber. For example, when it is a question of applying this device to welding operations using an electron beam, there may be cited the use of a flexible skirt 90 (see FIG. 8) of metallic braid which is suspended all round the chamber and which rubs against the supporting faces 9 and 10 of the bands. This skirt stops the X-rays emitted during the welding, etc. (see FIG. 8).

The static forces due to the difference in pressure between the interior and the exterior of the chamber are limited to those which result from the opening surface of the coupling. They are therefore very small. The dynamic forces are limited to the friction of the fluid-tight joints.

It is easy to close this coupling on itself when the mobile passage has to pass completely round the member in its displacement. It is in fact only necessary to join together the extremeties of the coupling by vulcanization.

In FIGS. 10 and 11 thre has been shown by way of example a slightly different version of the coupling and of the mobile chamber.

The coupling comprises guides 111 and 112 on the outer faces of the bands. These guides also serve as a joint on which the chamber 110 will slide. The bearing surfaces of this joint are marked with cross-hatching 118 on FIG. 11; these guides slide in grooves formed in the chamber.

The chamber 110 is provided with inlet and outlet joints 116 and 117. The bands are thus fixed on the sliding chamber. In this case, there is no need to support them by rollers or other devices.

In order to prevent the bands from being folded back longitudinally on themselves during the opening of the coupling, the guiding grooves in the chamber are inclined at 118 (FIG. 11) in order to keep the faces 114 and 113 (FIG. 10) constantly under tension.

There may possibly be an advantage in reducing the friction and perfecting the fluid-tightness between the chamber and the bands by utilizing liquid fluid-tightness joints such as those which have been recently developed. Magnetic particles are maintained in fluid suspension in the liquid and are held in position by the application of a magnetic field, in spite of the pressure forces which are applied on them.

If reference is made to FIG. 9 for example, a clearance of a few tenths of a millimeter between the bands 83 and the edges 84 and 85 of the chamber, by virtue of which clearance the chamber will be able to move without friction on the coupling constituted by the two bands, will be fed by a liquid suspension containing very fine magnetic particles.

These magnetic particles are subjected to a magnetic field by means of pole pieces which attract them on the edge 85 or 84. These magnetic forces retain the particles and therefore the suspension liquid is also retained by capilarity in spite of differences in pressure between the interior and the exterior of the chamber. The liquid constitutes a fluid-tight joint.

Following another form of embodiment, the flexible coupling is resistant to pressure while forming a cavity which extends above the path considered, and the slider, that is to say the mobile chamber, has its fluid-tight joints supported only on non-deformed parts of the coupling. In other words, the opening and closure inside the chamber of the two bands constituting the coupling are effected without causing deformation at the level of the joint bearing-surfaces.

In FIGS. 12a, 12b and 12c, there can be seen a coupling 121 having the shape of the Greek letter "Omega" (Ω) formed by two bands 122 and 123 (FIG. 12a) fixed on a wall 124 by their supporting faces 125 and 126. The two bands are applied against each other by their upper extremity edges 127. Their shape enables them to withstand an external pressure which reinforces the clamping effect of the edges 127 and thus facilitates fluid-tightness.

The interior of this coupling delimits the cavity 128 which is extended above the path 129 considered. Thinner portions 130 are deformed at 131 by the passage of a spacing device 132 carried by the slider and located inside this latter. The joints 133 of the slider 134 are supported and slide along non-deformed portions 135 of the coupling during the spacing apart of the thinner portions 130 of the slider.

According to an alternative form of construction, the longitudinal fluid-tight joint 136 possibly forms a part of the bands and the slider 134 slides over this joint. The frontal fluid-tight joints are carried by the slider according to arrangements similar to those described above.

During the mounting of the coupling, circlips 137 (FIG. 12c) are utilized in order to give a general rigidity to the coupling. They are removed and then replaced in order to permit displacement of the slider. Guiding grooves 138 may possibly be provided on the coupling in order to facilitate the positioning of the chamber 128 (see FIG. 12b).

In FIGS. 13a, 13b and 13c, there can be seen a coupling resting by its supporting faces 139 and 140 on the wall 124. On these supporting faces there are provided grooves 141 opening into pumping orifices 142 by means of which the cavity 128 is pumped to a vacuum. During the mounting in position of the coupling, the spacing apart between the non-symmetrical bands 143 and 144 is maintained constant by means of interposed grids 145 (FIG. 13c) engaged in ledges 156 and 157. The slider 134 rubs longitudinally on the non-deformed bearing surfaces of the bands 143 and 144.

In the interior of the mobile chamber 128, the band 144 is progressively deformed around the flexible hinge 148 thus raising at 149 a continuous cover 150. In FIG. 13b there has been shown a section 151 serving to displace the said cover by means of a mechanical device (not shown) forming part of the slider. If so desired, the flexibility of the cover 150 in the radial direction can be increased by forming the latter by means of a series of steel blades 151 covered with a plastic sheet 152 welded to the hinge 148 (FIG. 13b).

In FIGS. 14a and 14b there has been shown a coupling resting on its supporting faces 139 and 140. The bands comprise two cylindrical sectors 153 and 154, respectively welded to the bands 139 and 140. These two sectors are forced against each other at 155 and form a cavity 128 above the wall 124.

The slider 156 is engaged by profiled extremities between these two cylinders. This slider 156 becomes gradually wider and by this means causes a progressive torsional deformation of the cylindrical sectors 153 and 154 which roll respectively by wrapping themselves in the bands 139 and 140. The contact of the slider 156 is effected at 157 on non-deformed parts with respect to the initial support 155.

In FIG. 15, there has been shown a simple application of these FMP. There is provided a tube 159 of plastic material, on which are welded the bands forming the Omega (Ω) coupling 158 which constitutes the vacuum chamber for the tubes 159. The circlips 137 hold this coupling when the vacuum is interrupted. They are removed during the displacement of the mobile chamber 160 which carries tools for operating on the tube (for example an electron gun). The tubes 159 having a diameter of pre-determined value serve as spacers between the bands and prevent these from being clamped against each other by the effect of external pressure.

Another form of embodiment of the invention relates to the arrangements which permits the use of a chamber, the joints of which slide over the horizontal walls of the two bands, these arrangements, when it is possible to utilize them, permitting an easier construction of the chambers and at the same time preventing the collapse of the flexible coupling under the effect of the pressure in the space which is surmounted by the raised lips of the two bands.

These arrangements are shown in FIGS. 16, 17, 18 and 19; they relate more particularly to an example of welding by electronic bombardment of two sheets 161 and 162 along the path 163. It is known that this operation must be carried out under vacuum, that is to say between the media 1 (ambient atmosphere) and 2 (vacuum) complete fluid-tightness must be maintained. This fluid-tightness is obtained by means of the sheets or walls 161 and 162 and by means of a receptacle 164 applied on the opposite face to the weld by the joints 165 on the parts 161 and 162, and pumped through the orifice 166 finally by means of the mobile flexible coupling according to the invention.

This flexible coupling comprises the following parts: first of all two interposed supporting pieces 167 located on each side of the joint to be welded and resting directly on the pieces 161 and 162, two bands 168 comprising on the one hand a supporting sole 169 clamped on the pieces, and on the other hand a lip 170 surrounded by an excrescence 171 forming a tube. The lips of the two bands are forced against each other. The sliding chamber is shown at 172 and its joints at 173.

The first phenomenon which it is necessary to prevent is the collapse of these bands inside the space 174. This result is obtained by means of clamping members shown in FIGS. 17, 18, and 19, these chambers encircling the excrescence of the lips and being at the same time supported by their face 175 on the horizontal portion 168 of the bands.

These members serve to retain and limit the deformation of the bands, while at the same time they serve to ensure a suitable clamping effect between the lips of the bands in order to maintain perfect fluid-tightness. These members which are removable are composed of two symmetrical portions 176 and 177 in the form of a square and coupled together by attachment rods 178 which permit the rapid opening and closure of these two halves. These supports 176 and 177 are placed in position at the outset before putting the sliding chamber into movement; they are then removed in front of the chamber so as to permit its forward movement on the bands, and are replaced behind this chamber as it is displaced.

It is furthermore desirable to remedy the sinking of the band inside the space 174 at the point where the lips pass into the interior of the chamber. This is effected by means of a trolley 179 moving by means of bearing 180 inside grooves 181 formed in the interposed piece 167. This supporting trolley comprises application springs 182 which force a shoe 183 below the lips 170 so as to bring these latter back to level with the interposed pieces 167.

This trolley 179 is driven in displacement by the chamber itself, to which it is coupled by the parts 184. In FIGS. 16 and 17 there have been shown grooves 185 machined in the parts 167 and intended to facilitate the pumping to vacuum of the unit by means of the orifices 166.

Finally, in order to facilitate the placing in position of this tooling on the sheets 161 and 162 to be welded, the interposed parts 167 are advantageously coupled together by bracing members constituted by rods shown at 186 in FIG. 18 or alternatively by a perforated metal sheet. These spacers make it possible to so to speak "see" the joint 163. In the case where this fluid-tight coupling is intended for welding under vacuum by an electron beam by means of a gun fixed on the sliding chamber, these spacers cause at certain points an obstacle to the beam of electrons and would be cut by this beam. They are consumable and would be replaced at each new welding operation.

It will of course be understood that the present invention has been described only by way of a preferred example, and that technical equivalents may be introduced into its constituent parts without thereby departing from the scope of the said invention, as defined in the appended claims.

I claim:

1. A device for providing a vacuum-tight passage to a wall and displacing said passage along said wall following a predetermined rectilinear path, said device comprising a flexible coupling comprising two static bands having an L-shape, symmetrically arranged with respect to said predetermined path, each band being provided with a first face and a second face perpendicular to each other, said first faces of said two bands being in permanent vacuum-tight connection with said wall on either side of said path, whereas said second faces face each other across said path and are deformable between a closed position wherein they are hermetically engaged with each other and an opened position wherein they are disengaged from each other;

a mobile chamber positioned astride said flexible coupling and displaceable along said predetermined path while in sliding sealing contact with the exposed surface of said bands across portions of said second faces in said closed position;

means to perform deformation of said bands inside said chamber from the closed position to the opened position near one end of the chamber and from the opened position to the closed position near another end of the chamber, thereby providing a passage through said flexible coupling inside said chamber;

removable clamping means for exercising a clamping action retaining the bands in the closed position of said flexible coupling outside the mobile chamber;

means for displacing said chamber with respect to said coupling along said path;

profiled guiding ribs formed on said second faces of said bands and cooperating guiding grooves of said mobile chamber for slidably and sealingly engaging said ribs, at least at the entrance and exit of the chamber.

2. A device according to claim 1 wherein said mobile chamber comprises an internal part provided with bearings for separating said second faces of the bands away from each other, an external part in hermetic sliding connection with the exposed surface of the bands through vacuum seals, and a supporting plate connecting said internal part and external part together and provided with access holes.

3. A device according to claim 2 wherein said seals delimitate an evacuable guard-ring around the chamber.

4. An electron beam welding apparatus comprising
a device according to claim 1 wherein said wall is formed by parts to be welded;
an electron gun coupled by a flexible connection to the means for providing a passage inside of the mobile chamber;
a vacuum chamber formed by a sheet of rubber entirely surrounding the parts to be welded and wholly collapsed on said parts, said sheet forming a single piece with said flexible coupling.

5. A device for providing a vacuum-tight passage to a wall and displacing said passage along said wall following a predetermined rectilinear path, said device comprising a flexible coupling comprising two static bands having an L-shape, symmetrically arranged with respect to said predetermined path, each band being provided with a first face and a second face perpendicular to each other, said first faces of said two bands being in permanent vacuum-tight connection with said wall on either side of said path, whereas said second faces face each other across said path and are deformable between a closed position wherein they are hermetically engaged with each other and an opened position wherein they are disengaged from each other;

a mobile chamber positioned astride said flexible coupling and displaceable along said predetermined path while in sliding sealing contact with the exposed surface of said bands across portions of said second faces in said closed position;

means to perform deformation of said bands inside said chamber from the closed position to the opened position near one end of the chamber and from the opened position to the closed position near another end of the chamber, thereby providing a passage through said flexible coupling inside said chamber;

two level blocks interposed respectively between each of said bands and the wall, said blocks being arranged on each side of said rectilinear path and being provided with temporary cross-bracing members and guiding rails;

removable band-supporting pieces constituted by two parts having a shape complementary to that of the bands and enclosing the latter for maintaining said bands above the rectilinear path, when subjected to pressure.

6. A device according to claim 5, further comprising
removable clamping means for exercising a clamping action on the second faces of the bands outside the chamber, thereby retaining them in the closed position, and a trolley carried by said chamber and movable therewith, said trolley being arranged between the internal surface of said bands and the external surface of said wall, in a space between said level blocks, for supporting and re-positioning said bands with respect to said clamping members at the back of the mobile chamber.

7. A device for providing a vacuum-tight passage to a wall and displacing said passage along said wall following a predetermined rectilinear path, said device comprising a flexible coupling comprising two static bands having an L-shape, symmetrically arranged with respect to said predetermined path, each band being provided with a first face and a second face perpendicular to each other, said first faces of said two bands being in permanent vacuum-tight connection with said wall on either side of said path, whereas said second faces face each other across said path and are deformable between a closed position wherein they are hermetically engaged with each other and an opened position wherein they are disengaged from each other;

a mobile chamber positioned astride said flexible coupling and displaceable along said predetermined path while in sliding sealing contact with the exposed surface of said bands across portions of said second faces in said closed position;

means to perform deformation of said bands inside said chamber from the closed position to the opened position near one end of the chamber and from the opened position to the closed position near another end of the chamber, thereby providing a passage through said flexible coupling inside said chamber; and wherein said bands when in the closed position form a profile having the shape of an omega ($\Omega$).

8. A device for providing a vacuum-tight passage to a walls and displacing said passage along said wall following a predetermined rectilinear path, said device comprising a coupling forming a tunnel having a continuous, progressively openable end re-closable cover over said rectilinear path, said coupling comprising a first portion composed of a fluid-tight sole applied against the wall, a rigid edge coupled by a fluid-tight hinge to a flexible pressure-resistant cover, and a second portion formed by a sole and a supporting edge, said fluid-tight soles being connected to pumping sets;

temporary spacing devices for stiffening the flexible coupling;

a mobile chamber positioned astride said coupling and displaceable along said path while in sealing connection with said coupling;

means to open and re-close said cover inside said chamber, thereby providing a passage through said coupling inside the chamber;

clamping means for retaining the cover in the closed position outside the chamber.

9. A device for providing a vacuum-tight passage to a wall and displacing said passage along said wall following a predetermined rectilinear path, said device comprising a flexible coupling comprising two static bands having an L-shape, symmetrically arranged with respect to said predetermined path, each band being provided with a first face and a second face perpendicular to each other, said first faces of said two bands being in permanent vacuum-tight connection with said wall on either side of said path, whereas said second faces face each other across said path and are deformable between a closed position wherein they are hermetically engaged with each other and an opened position wherein they are disengaged from each other;

a mobile chamber positioned astride said flexible coupling and displaceable along said predetermined path while in sliding sealing contact with the exposed surface of said bands across portions of said second faces in said closed position;

means to perform deformation of said bands inside said chamber from the closed position to the opened position near one end of the chamber and from the opened position to the closed position near another end of the chamber, thereby providing a passage through said flexible coupling inside said chamber;

supporting rollers for said bands inside said mobile chamber and fluid-tight joints pressing on said bands;

an electron gun comprising focusing lenses and its accessories coupled by a flexible connection to the fluid-tight passage of said mobile chamber;

an apparatus for protection against X-rays resulting from the operation of electron welding, disposed at the base of said mobile chamber and in contact with the parts applied against the wall, said protection apparatus being constituted by metallic wires or chains.

* * * * *